United States Patent
van Kervinck et al.

(10) Patent No.: US 10,600,733 B2
(45) Date of Patent: Mar. 24, 2020

(54) FABRICATING UNIQUE CHIPS USING A CHARGED PARTICLE MULTI-BEAMLET LITHOGRAPHY SYSTEM

(71) Applicant: ASML Netherlands B.V., Veldhoven (NL)

(72) Inventors: Marcel Nicolaas Jacobus van Kervinck, The Hague (NL); Vincent Sylvester Kuiper, The Hague (NL); Marco Jan-Jaco Wieland, Delft (NL)

(73) Assignee: ASMl Netherlands B.V., Veldhoven (NL)

( * ) Notice: Subject to any disclaimer, the term of this patent is extended or adjusted under 35 U.S.C. 154(b) by 0 days.

(21) Appl. No.: 16/572,592

(22) Filed: Sep. 16, 2019

(65) Prior Publication Data

US 2020/0013712 A1    Jan. 9, 2020

Related U.S. Application Data

(63) Continuation of application No. 15/389,593, filed on Dec. 23, 2016, now Pat. No. 10,418,324.
(Continued)

(51) Int. Cl.
*H01L 25/00* (2006.01)
*H01L 23/528* (2006.01)
(Continued)

(52) U.S. Cl.
CPC .......... *H01L 23/528* (2013.01); *G03F 7/2059* (2013.01); *G06F 17/5068* (2013.01);
(Continued)

(58) Field of Classification Search
None
See application file for complete search history.

(56) References Cited

U.S. PATENT DOCUMENTS 4,875,971 A   10/1989   Orbach et al.
4,879,605 A   11/1989   Warkentin et al.
(Continued)

FOREIGN PATENT DOCUMENTS

CN   101271825 A   9/2008
EP   0712136 A2   5/1996
(Continued)

OTHER PUBLICATIONS

Application-specific IC Nov. 25, 2016 (Nov. 25, 2016), XP055403899, Internet: https://en.wikipedia.org/w/index.php?title=Application-specific_integrated_circuit&oldid=751376110.
(Continued)

*Primary Examiner* — Lincoln D Donovan
*Assistant Examiner* — Khareem E Almo
(74) *Attorney, Agent, or Firm* — Finnegan, Henderson, Farabow, Garrett & Dunner, LLP

(57) ABSTRACT

Method of manufacturing electronic devices using a maskless lithographic exposure system using a maskless pattern writer. The method comprises generating beamlet control data for controlling the maskless pattern writer to expose a wafer for creation of the electronic devices, wherein the beamlet control data is generated based on a feature data set defining features selectable for individualizing the electronic devices, wherein exposure of the wafer according to the beamlet control data results in exposing a pattern having a different selection of the features from the feature data set for different subsets of the electronic devices.

20 Claims, 8 Drawing Sheets

Related U.S. Application Data

(60) Provisional application No. 62/413,470, filed on Oct. 27, 2016.

(51) Int. Cl.

| | | |
|---|---|---|
| G06F 17/50 | (2006.01) | |
| H01L 21/768 | (2006.01) | |
| G03F 7/20 | (2006.01) | |
| H01L 25/065 | (2006.01) | |
| H01L 27/02 | (2006.01) | |
| H01L 29/06 | (2006.01) | |
| H01L 21/263 | (2006.01) | |
| H01L 27/06 | (2006.01) | |

(52) U.S. Cl.
CPC ........ G06F 17/5077 (2013.01); H01L 21/263 (2013.01); H01L 21/768 (2013.01); H01L 25/0655 (2013.01); H01L 27/0207 (2013.01); H01L 29/0684 (2013.01); H01L 29/0692 (2013.01); *G03F 7/2061* (2013.01); *H01L 27/0617* (2013.01)

(56) References Cited

U.S. PATENT DOCUMENTS

| | | |
|---|---|---|
| 4,974,736 A | 12/1990 | Okunuki et al. |
| 5,093,550 A | 3/1992 | Gerber et al. |
| 5,410,124 A | 4/1995 | Jackson |
| 5,604,143 A | 2/1997 | Ishida et al. |
| 5,733,711 A | 3/1998 | Juengling |
| 6,063,685 A | 5/2000 | Steffan et al. |
| 7,075,093 B2 | 7/2006 | Gorski et al. |
| 7,107,560 B1 | 9/2006 | New |
| 7,316,934 B2 | 1/2008 | Mangell |
| 7,391,499 B2 | 6/2008 | Schmidt |
| 7,407,252 B2* | 8/2008 | Chabreck .............. B82Y 10/00 347/19 |
| 7,590,966 B2* | 9/2009 | Sandstrom .......... G03F 7/70291 250/492.21 |
| 7,721,090 B1 | 5/2010 | Deepak et al. |
| 7,818,569 B2 | 10/2010 | Devadas et al. |
| 7,840,803 B2 | 11/2010 | Clarke et al. |
| 7,842,525 B2 | 11/2010 | Sandstrom |
| 8,492,072 B2 | 7/2013 | Sandtner |
| 8,539,395 B2* | 9/2013 | Ivansen .............. G03F 7/70291 430/322 |
| 8,754,538 B2 | 6/2014 | Ortner |
| 8,767,185 B2* | 7/2014 | Sandstrom .......... G03F 7/70291 355/77 |
| 8,872,833 B2* | 10/2014 | Van Dyke ...... G01R 31/318544 345/502 |
| 8,893,059 B2 | 11/2014 | Carroll |
| 8,896,809 B2* | 11/2014 | Stoeldraijer ........ G03F 7/70425 355/30 |
| 8,972,229 B2* | 3/2015 | Deng .................. G06F 17/5009 257/72 |
| 9,140,978 B2 | 9/2015 | Ken |
| 9,171,806 B2 | 10/2015 | Othner |
| 9,224,694 B2 | 12/2015 | Pagani |
| 9,846,368 B2* | 12/2017 | Tinnemans ......... G03F 7/70291 |
| 2001/0028991 A1 | 10/2001 | Inanami et al. |
| 2001/0046730 A1 | 11/2001 | Suzuki et al. |
| 2002/0010905 A1 | 1/2002 | Inanami et al. |
| 2002/0074666 A1 | 6/2002 | Usami |
| 2003/0064531 A1 | 4/2003 | Mautz et al. |
| 2003/0144760 A1 | 7/2003 | Mangell |
| 2004/0019791 A1 | 1/2004 | Whyte |
| 2004/0095172 A1 | 5/2004 | Usami |
| 2005/0047543 A1 | 3/2005 | Sandstrom |
| 2005/0140502 A1 | 6/2005 | Ashizawa |
| 2005/0177268 A1 | 8/2005 | Morinaga et al. |
| 2005/0225348 A1 | 10/2005 | Zettler |
| 2006/0064191 A1 | 3/2006 | Naya et al. |
| 2006/0209313 A1 | 9/2006 | van den Akker et al. |
| 2006/0221320 A1 | 10/2006 | Bleeker et al. |
| 2007/0116276 A1 | 5/2007 | Tsurumoto |
| 2007/0134560 A1* | 6/2007 | Dirksen .............. G03F 7/70291 430/5 |
| 2007/0195834 A1 | 8/2007 | Tanaka et al. |
| 2007/0242252 A1 | 10/2007 | Tinnemans |
| 2008/0027576 A1 | 1/2008 | Kyoh |
| 2008/0119956 A1 | 5/2008 | Mangeil |
| 2008/0121709 A1 | 5/2008 | Hayashi et al. |
| 2009/0011345 A1* | 1/2009 | Tinnemans ......... G03F 7/70291 430/30 |
| 2009/0100392 A1 | 4/2009 | Ivaldi |
| 2009/0162760 A1 | 6/2009 | Hoshino et al. |
| 2009/0315193 A1 | 12/2009 | Ortner |
| 2010/0279231 A1 | 11/2010 | Sandtner |
| 2012/0271444 A1 | 10/2012 | Matsumoto |
| 2013/0127442 A1 | 5/2013 | Satoh et al. |
| 2014/0170566 A1 | 6/2014 | Ivan sen et al. |
| 2015/0012439 A1 | 1/2015 | Sakurai et al. |
| 2015/0026650 A1 | 1/2015 | Yeric |
| 2016/0126062 A1 | 5/2016 | Muraki et al. |
| 2016/0148664 A1 | 5/2016 | Katoh et al. |
| 2016/0254227 A1 | 9/2016 | Leobandung |
| 2017/0269483 A1* | 9/2017 | Tinnemans ......... G03F 7/70291 |

FOREIGN PATENT DOCUMENTS

| | | |
|---|---|---|
| EP | 1598854 A1 | 11/2005 |
| JP | S 58116732 | 7/1983 |
| JP | 4-273115 | 9/1992 |
| JP | 05 343278 | 12/1993 |
| JP | A 09 007924 | 1/1997 |
| JP | 1998 090874 A | 4/1998 |
| JP | 2001 109128 | 4/2001 |
| JP | 2002 055431 A | 2/2002 |
| JP | 2002 305141 A | 10/2002 |
| JP | 2005-057203 | 3/2005 |
| JP | 2005 159198 A | 7/2005 |
| JP | 2005-244132 | 9/2005 |
| JP | 2006 139165 A | 6/2006 |
| JP | 2007 514987 A | 6/2007 |
| JP | 2007 260295 | 10/2007 |
| JP | 2008 047857 A | 2/2008 |
| JP | 2010 093663 | 4/2010 |
| JP | 2011 108830 | 6/2011 |
| JP | 2011 124587 | 6/2011 |
| JP | 2011 253226 A | 12/2011 |
| JP | 2012-12712 A | 1/2012 |
| JP | 2014 515885 A | 7/2014 |
| JP | 2016 086103 A | 5/2016 |
| WO | WO 1998 052226 | 11/1998 |
| WO | WO 1999 042945 | 8/1999 |
| WO | WO 2001 039269 A1 | 5/2001 |
| WO | WO 2002 084719 | 10/2002 |
| WO | WO 2003 090259 A2 | 10/2003 |
| WO | WO 2004 105125 | 12/2004 |
| WO | WO 2006 064921 | 6/2006 |
| WO | WO 2008 043934 | 4/2008 |
| WO | WO 2010 134026 | 11/2010 |
| WO | WO 2010 134026 A1 | 11/2010 |
| WO | WO 2011 003201 A1 | 1/2011 |
| WO | WO 2011 051301 | 5/2011 |
| WO | WO 2011 107601 A1 | 9/2011 |
| WO | WO 2011 107603 | 9/2011 |
| WO | WO 2011 117253 | 9/2011 |
| WO | WO 2012 062726 | 5/2012 |
| WO | WO 2012 062727 A1 | 5/2012 |
| WO | WO 2012 143548 | 10/2012 |
| WO | WO 2012 143555 A2 | 10/2012 |
| WO | WO 2015 008021 A1 | 1/2015 |

(56) References Cited

FOREIGN PATENT DOCUMENTS

| WO | WO 2015 150398 | 10/2015 |
|---|---|---|
| WO | WO 2016 156378 A1 | 10/2016 |

OTHER PUBLICATIONS

Anonymous, "Gate array—Wikipedia" Jul. 16, 2016, XP055403902J Internet:URL: https://en.wikipedia.org/w/index.php? title=Gate_array&oldid=728662966.
Ed Korczynski, "Multibeam Patents Direct Deposition & Direct Etch", https://semimd.com/blog/2016/11/14, Nov. 14, 2016.
Mark Lapedus, "New Patterning Paradigm?", https://semiengineering.com, Apr. 16, 2015.
Parker et al: "A high throughput electron-beam direct-write lithography system", Microlithography World, US, Edit 9, nr. 3, Jan. 1, 2000 (Jan. 1, 2000), bladzijden 22. 24-25.

* cited by examiner

FABRICATING UNIQUE CHIPS USING A CHARGED PARTICLE MULTI-BEAMLET LITHOGRAPHY SYSTEM

CLAIM FOR PRIORITY

This application is a continuation application of application Ser. No. 15/389,593, entitled "FABRICATING UNIQUE CHIPS USING A CHARGED PARTICLE MULTI-BEAMLET LITHOGRAPHY SYSTEM," filed Dec. 23, 2016, which claims priority from U.S. provisional application No. 62/413,470 filed on Oct. 27, 2016. All abovementioned applications are hereby incorporated by references in their entireties.

TECHNICAL FIELD

The invention relates to a method of manufacturing, i.e. fabricating electronic devices such as semi-conductor chips. More specifically, the invention relates to the fabrication of unique chips using a charged particle multi-beamlet lithography machine, wherein the uniqueness of the chips is defined by features included in the chips. Consequently the invention equally relates to unique chips produced using this new method of manufacture, as well as to so called "fabs", i.e. manufacturing facilities applying this novel method, and to maskless lithographic exposure system adapted for executing the improved method of manufacture.

BACKGROUND ART

In the semiconductor industry, lithography systems are used to create, i.e. fabricate such electronic devices, typically in the form of integrated circuits formed on silicon wafer, commonly referred to as semiconductor chips. Photolithography utilizes reusable optical masks to project an image of a pattern representing the desired circuit structures onto a silicon wafer as part of the manufacturing process. The mask is used repeatedly to image the same circuit structures on different parts of a silicon wafer and on subsequent wafers, resulting in a series of identical chips being fabricated with each wafer, each chip having an identical circuit design.

In contemporary days, various technologies relating to data security, traceability, and anti-counterfeiting create an increasing need for unique chips having unique circuits or codes, or other unique hardware features for diversification of the chips. Such unique chips are known and often implement a security related operation in an obfuscated manner requiring the chip to be truly unique. The known unique chips are typically realized after the manufacture of a chip, e.g. by manufacturing a series of identical chips using mask based lithography and then, after manufacture, disrupting certain connections in the chip or by assessing the uniqueness of the chip afterwards upon inspection and control of certain features. The masks used in this process are expensive to produce, and manufacturing a unique mask for each single chip is clearly much too expensive, for which reason mask based photolithography is considered unsuitable for fabricating unique chips.

Hence it has been suggested to utilize maskless lithography for the purpose of creating unique chips. With maskless lithography no mask is used, and instead the required pattern representing the circuit design is input to the maskless lithography system in the form of a data file such as a GDSII or OASIS file containing the circuit design layout to be transferred to the target, e.g. wafer, to be exposed by the maskless lithography system.

A maskless lithography and data input system is disclosed in WO 2010/134026 in the name of Applicant of the present invention. WO 2010/134026 is hereby incorporated by reference in its entirety. The disclosed maskless system writes patterns onto wafers directly using charged particle beamlets such as electron beamlets. Because the desired pattern for exposing each chip is represented as data instead of a mask, it becomes possible to utilize such system for the manufacture of unique chips. The pattern data that is input to the exposure system, representing the unique electronic devices or chips to be created, may be made unique by using a different GDSII input file for each unique electronic device to be created.

WO 2011/117253 and WO 2011/051301, both assigned to the Applicant of the present invention and hereby incorporated by reference in their entirety, disclose various examples of electronic devices or chips that can be created using a charged particle lithography system.

A straight forward method of creating secure, at least unique devices, i.e. using the known maskless exposure system, may however not be optimized, at least adapted for securely producing unique electronic devices. Disadvantageously, the processing of GDSII or OASIS files associated herewith is typically performed outside of the operations of the operator of the lithography system. Moreover, the processed GDSII/OASIS files may be used and stored over a longer period of time.

It is deemed desirable according insight underlying and in fact part of the present invention to minimize exposure and exposure time of the unique design data used in the creation of the unique electronic devices or chips for security reasons, as the uniqueness of the electronic device or chip will typically be used for data security, traceability and anti-counterfeiting applications.

SUMMARY OF THE INVENTION

The present invention provides a solution for manufacture of unique electronic devices by implementing different features from a set of features in different ones of the electronic devices. The electronic devices may comprise semiconductor chips produced by exposing patterns on a semiconductor wafer, and the features may include, for example, one or more of a circular shaped feature, a feature shaped as a horizontal line, a feature shaped as a vertical line, a feature shaped as a plus sign, and combinations thereof, which result in electrical connections being formed within or between layers of the chip when exposed on the wafer. The features may form a part of or a complete electronic circuit in the electronic device, and the electronic circuit may be adapted for generating a certain predetermined output as a response to a certain predetermined electronic input.

One way of making such electronic devices unique is by selecting different sets of features to be used for making different individual electronic devices of a set of electronic devices, thereby individualizing the electronic devices. Such a set of electronic devices may be devices which all perform the same function, such as providing a predetermined electronic output as a response to a certain predetermined electronic input. Such devices may be used, for example, in secure systems for providing a response enabling secure identification of the device. When the predetermined input is presented to the electronic devices during use, different outputs are generated by each individualized electronic device, thus enabling secure identification of the device.

The features from which a selection is to be made for individualizing an electronic device or a batch of electronic devices can be defined by a feature data set, which can be provided separately from design layout data which defines a common design layout applicable to all the electronic devices. The feature data set and/or the common design layout data may be, for example, data files based on a GDSII or OASIS file format. In case a common design layout is used, a part of the common design layout (e.g. a part of the area of the layout) can be undefined or left blank or set to a predetermined value, and the features for this part of the design layout may be derived from the feature data set. In this way, the features selected from the feature data set can complement the features defined in the design layout data, so that the common design layout and the selected features for individualizing the electronic device together define the set of features for each individual electronic device.

It is also possible to create the individualized part of the electronic device and the common part of the electronic device separately. For example, the common design layout part may be created utilizing photolithography at a relatively lower cost, while the individualized part may be created using a maskless lithography system. The to be individualized part of the electronic device can be individualized by selecting different features for different subsets of the electronic devices. The selection of the features can be made at a late processing stage close to or within the maskless lithographic exposure system, thereby minimizing the potential for public exposure of the specific features used to individualize a particular electronic device.

According to an aspect of the invention a method of manufacturing electronic devices is proposed, using a maskless lithographic exposure system. The maskless lithographic exposure system can use a maskless pattern writer. The method can comprise generating beamlet control data for controlling the maskless pattern writer to expose a wafer for creation of the electronic devices. The beamlet control data can be generated based on a feature data set defining features selectable for individualizing the electronic devices. Exposure of the wafer according to the beamlet control data can result in exposing a pattern having a different selection of the features from the feature data set for different subsets of the electronic devices.

The maskless pattern writer may be a raster scanning based maskless pattern writer, in which case the beamlet control data may take the form of pattern bitmap data. The maskless pattern writer may be a vector scanning based maskless pattern writer, in which case the beamlet control data may be formatted in a manner suitable for vector scanning. Other types of maskless pattern writer may also be used.

The electronic devices can be individualized or made unique by a different selection of the features for each of the electronic devices or subsets of the electronic devices. In this way, a set of electronic devices may be manufactured which are partly identical and partly different, i.e. having the same set of features formed in a common part of all of the electronic devices of the set, and having a set of features in an individualized part of the electronic device which is different in each electronic device or in each subset of the electronic devices. The set of electronic devices may, for example, consist of or include semiconductor chips all formed on a single wafer.

Advantageously the method enables the creation of the individualized area of the electronic devices to remain within the operations of the maskless lithographic exposure system and public exposure time of the design data of the individualized area is minimized.

In an embodiment, generating the beamlet control data can be additionally based on design layout data defining structures applicable for all of the electronic devices to be manufactured from the wafer. The feature data set can define the plurality of features selectable for complementing the structures defined in the design layout data. These structures and features may be, for example, electronic circuit elements or portions of circuit elements such as transistors, diodes, resistors, connecting lines, and/or vias, and the structures may be interconnected to form an electronic circuit in the completed electronic device.

Advantageously the required processing power and memory for generating the beamlet control data may remain low, in that the design layout data can be reused for the creation of multiple electronic devices, where utilizing the known method of creating unique electronic devices requires design layout data for each unique electronic device and thus capacity and processing time for each unique design manufactured.

In an embodiment the feature data set can comprise a plurality of data files, wherein each data file comprises a subset of the features applicable to one of the different subsets of the electronic devices. Thus, the design layout of the part of the electronic device that is to be individualized may be obtained from a file containing the features for one individualized electronic device.

In an embodiment the feature data set can comprise a data file, wherein the data file comprises a plurality of subsets of the features, wherein each subset of the features is applicable to one of the different subsets of the electronic devices. Thus, the design layout of the part of the electronic device that is to be individualized may be obtained from a file containing the features for multiple individualized electronic devices.

In an embodiment the step of generating the beamlet control data can be additionally based on selection data. The selection data can define a selection of the features of the feature data set for individualizing the electronic devices, or in case the design layout data is used for complementing the structures for each electronic device to be manufactured from the wafer. The selection data can define a different selection of the features for different subsets of the electronic devices. Thus, the design layout of the part of the chip that is to be individualized can be generated based on the selection data, which defines the features that are selected for individualizing the electronic devices, or in case the design layout data is used for complementing the structures for each subset of the electronic device to be manufactured from the wafer.

In an embodiment at least one selection of the features of the feature data set can comprise a plurality of at least one of the features. Thus, a feature defined in the feature data set may be selected and used multiple times.

In an embodiment the feature data set can define a plurality of different features. Thus, the feature data set may include features which are different from one another, possibly only different features.

In an embodiment the feature data set can includes at least one of: a circular shaped feature; a feature shaped as a line having a first orientation and having a first width; a feature shaped as a line having a second orientation perpendicular to the first orientation; a feature shaped as a line having a second width different from the first width; a feature shaped as an elbow structure; a feature shaped as a rectangle; a feature shaped as a plus sign. A single feature may be shaped as a combination of two or more of such features. The features may enable electrical connections within or between layers of the chip when exposed on the wafer.

In an embodiment the step of generating the beamlet control data can be additionally based on feature meta data, wherein the feature meta data specifies a location where the features from the feature data set, which can be selected using the selection data, are to be created for individualizing the electronic devices. This location can be the location of a to be individualized area in the chip design.

In an embodiment the features defined in the feature data set can be selected to be included in the beamlet control data on the basis of both the feature meta data and the selection data.

In an embodiment the method can further comprise generating one or more bitmap fragments from the selected features, wherein each bitmap fragment defines a part of a stripe to be exposed on the wafer. The method can further comprise selecting a bitmap fragment from the one or more bitmap fragments for inclusion in the beamlet control data based on the feature meta data. Bitmap fragments may be used to complement a common design bitmap or may be combined for the generation of a bitmap defining a scan line or stripe to be exposed on the wafer.

The design layout data may be received in the maskless lithographic exposure system via a first network path. The selection data may be received in the maskless lithographic exposure system via a second network path separate from the first network path. This enables provisioning of the design layout data and the selection data from a different sources.

As the design layout data, for example in the form of a GDSII or OASIS data file, typically concerns large amounts of data while the selection data may take the form of a relatively small file, the first network path may have a higher data transmission bandwidth than the second network path. The first network path is for example based on fiber optics network connections. The second network path is for example based on cat6 Ethernet network connections.

Typically the selection data will be received from a source external to the maskless lithographic exposure system, such as from a black box device within a manufacturing part of the fab. In this example the selection data may advantageously be received via the second network path which may also be used to control the maskless lithographic exposure system. Thus, existing network interfaces may be used for the provisioning of the selection data to the maskless lithographic exposure system.

The feature meta data typically concerns relatively small amounts of data and may be received in the maskless exposure system via the first or the second network path.

In an embodiment the electronic devices can be semiconductor chips and the maskless pattern writer can be a charged particle multi-beamlet lithography machine or e-beam machine.

The selection data may be received in an encrypted form to provide additional data security within the fab in the process of creating unique electronic devices.

The feature meta data may be encrypted to provide additional data security within the fab in the process of creating unique electronic devices.

The beamlet control data may be encrypted to provide additional data security within the fab in the process of creating unique electronic devices.

According to an aspect of the invention an electronic device such as semi-conductor chip is proposed, which is created using one or more of the above described methods.

In an embodiment the electronic device can be a truly unique semi-conductor chip different, e.g. functionally different, from any other semi-conductor chip using the method of the invention.

According to an aspect of the invention a maskless lithographic exposure system is proposed configured to perform one or more of the above described methods.

In an embodiment the maskless lithography exposure system can comprise a black box device that is configured to generate selection data defining a selection of the features of the feature data set for individualizing the electronic devices to be manufactured from the wafer. The selection data can define a different selection of the features for different subsets of the electronic devices.

The black box may be owned by a third party, e.g. an IP block owner or the owner of the manufactured chip, or a key management infrastructure owner. Advantageously the black box can be located within the fab close to the operations of the lithography machine, thereby minimizing public exposure of the selection data. This in contrast to known chip manufacturing solutions, where a black box for individualizing chips is typically located outside of the fab and used to individualize the chips after being created.

According to an aspect of the invention a semiconductor fabrication plant is proposed comprising a maskless lithography exposure system as described above.

According to an aspect of the invention a lithography subsystem comprising a rasterizer and a maskless pattern writer is proposed. The maskless pattern writer is e.g. a charged particle multi-beamlet lithography machine or e-beam machine. The rasterizer can be configured to generate beamlet control data for controlling the maskless pattern writer to expose a wafer for the creation of electronic devices. The beamlet control data can be generated based on a feature data set defining features selectable for individualizing the electronic devices. Exposure of the wafer according to the beamlet control data can result in exposing a pattern having a different selection of the features from the feature data set for different subsets of the electronic devices.

In an embodiment of the lithography subsystem, the generating of the beamlet control data can be additionally based on selection data. The selection data can define a selection of the features of the feature data set for individualizing the electronic devices. The selection data can define a different selection of the features for different subsets of the electronic devices to be manufactured from the wafer. In an embodiment of the lithography subsystem, the generating of the beamlet control data can be additionally based on feature meta data.

Another aspect of the invention relates to an electronic device created using the method and/or the lithography subsystem described above.

Yet another aspect of the invention relates to an electronic device comprising a semiconductor chip which comprises a plurality of structures formed in three or more layers of the semiconductor chip, wherein the semiconductor chip is a member of a set of semiconductor chips, each of the semiconductor chips of the set having a set of common structures which are present in all of the semiconductor chips of the set and a set of non-common structures which are only present in a subset of the semiconductor chips of the set, and wherein the non-common structures are formed on at least a first one of the layers having a second one of the layers above the first layer and having a third one of the layers below the first layer.

Yet a further aspect of the invention relates to an electronic device comprising a semiconductor chip which comprises a plurality of structures formed in a plurality of layers of the semiconductor chip, wherein the semiconductor chip is a member of a set of semiconductor chips, each of the semiconductor chips of the set having a set of common structures which are present in all of the semiconductor chips of the set and a set of non-common structures which are only present in a subset of the semiconductor chips of the set, and wherein the non-common structures include at least one of: connections between metal layers of the plurality of layers; connections between a metal layer and a gate in a contact layer of the plurality of layers; connections in a local interconnect layer of the plurality of layers; and a P- or N-doped diffusion region of a transistor or diode of one of the plurality of layers.

In the electronic devices described above, the common structures and the non-common structures of the semiconductor chip may be interconnected to form an electronic circuit. The electronic device may comprise at least one input terminal for receiving a challenge and at least one output terminal for outputting a response. The electronic circuit may form a challenge-response circuit connected to the at least one input terminal and the at least one output terminal, and the challenge-response circuit may be adapted for generating a response at the at least one output terminal based on a challenge applied to the at least one input terminal, the challenge and the response having a predetermined relationship.

Various aspects and embodiments of the invention are further defined in the following description and claims.

Hereinafter, embodiments of the invention will be described in further detail. It should be appreciated, however, that these embodiments may not be construed as limiting the scope of protection for the present invention.

BRIEF DESCRIPTION OF THE DRAWINGS

Embodiments will now be described, by way of example only, with reference to the accompanying schematic drawings in which corresponding reference symbols indicate corresponding parts, and in which.

The figures are meant for illustrative purposes only, and do not serve as restriction of the scope or the protection as laid down by the claims.

DESCRIPTION OF EMBODIMENTS

In the following examples reference is made to semiconductor chips, but it is to be understood that the invention is not limited to chips and applies more generally to the creation of electronic devices having individualized, e.g. unique features. The electronic device may be a read only memory (ROM). For example, batches of chips with individualized ROM load may be created using the invention. Such batches are typically small batches, e.g. created from one or less than one wafer.

The process performed by charged particle multi-beamlet lithography is also being referred to as an electron beam or e-beam exposure. The electron beam exposure method is a maskless exposure method. The electron beams used for writing a target such as a wafer during electron beam exposure are also being referred to as beamlets.

Unique chips are designed to be unique with respect to other chips. This does not exclude the possibility that more than one unique chip can be made using the invention, for example to create a spare unique chip for use in case the original unique chip is damaged, to created batches of the same chip or for any other reason. A unique semi-conductor chip that is functionally different from any other semi-conductor chip may be referred to as a truly unique chip. The creation of a visually readable unique ID on a chip may also be regarded as creating a unique chip. Copies of the unique chip may be made by repeating the creation of the chip on different wafers or a single wafer may include one or more copies of the unique chip.

Figure 1A:
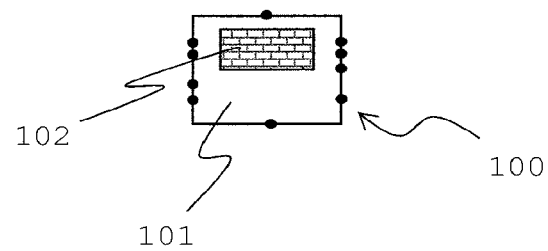
FIG. 1a shows a simplified unique chip of an exemplary embodiment of the invention.
Figure 1B:
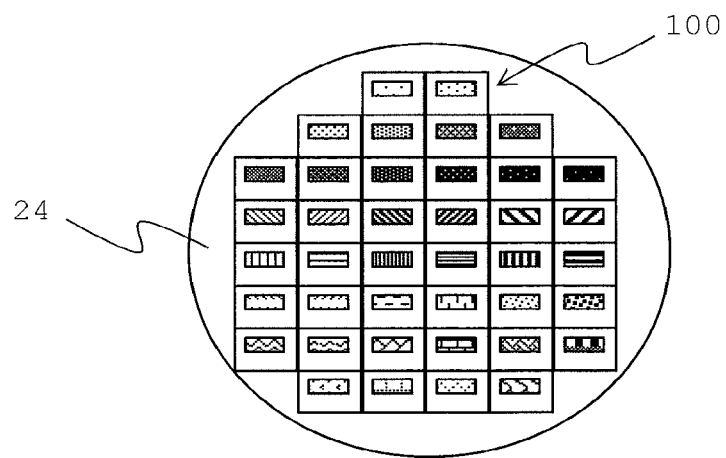
FIG. 1b shows a wafer with multiple unique chips of an exemplary embodiment of the invention.

FIG. 1a shows an exemplary simplified unique chip 100 containing a common part 101 and an individualized area 102. FIG. 1b shows an exemplary wafer 24 with unique chips created thereon. The common part 101 may be replicated in other chips created on the wafer 24 resulting in multiple chips having the same identical part. The individualized area 102 may be different from other chips created on the wafer 24. This is illustrated in FIG. 1b where the wafer 24 is shown containing a unique chip 100 and 39 other unique chips, each unique chip having a different individualized area. The combined common part 101 and individualized area 102 may result in unique chip 100.

The individualized area 102 may be realized by selecting and writing specific features, which are selectable from a feature data set. Other unique chips may have a different selection of the features from the feature data set, resulting in the realization of different interconnections within a layer or between layers of the electronic circuit.

The common part 101 may be created using photolithography, but is preferably created using charged particle multi-beam lithography. The individualized area is typically created using charged particle multi-beam lithography.

Figure 2:
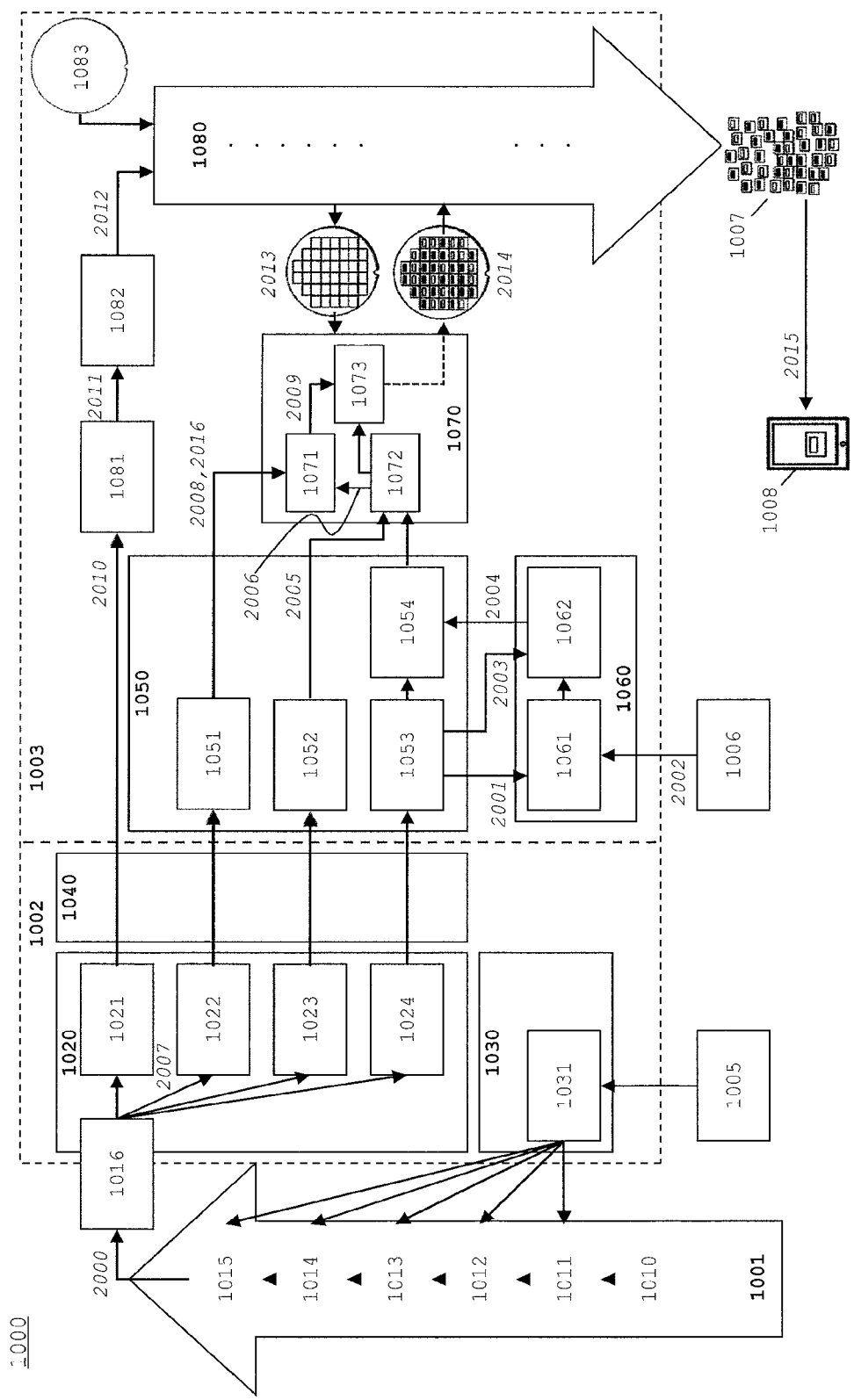
FIG. 2 shows a schematic diagram of systems involved in the manufacturing of electronic devices according to an exemplary embodiment of the invention.

FIG. 2 shows a semiconductor fabrication plant 1000, including systems and processes involved in the manufacturing of unique semi-conductor chips, of an exemplary embodiment of the invention. In case reference numbers used in FIG. 2 refer to processes or operations, these reference numbers may also refer to computational units performing the processes or operations. Each of the shown processes and operations may be performed by a dedicated unit. Alternatively, one computational unit may perform multiple processes or operations shown in FIG. 2. A computational unit is for example a computer system including one or more processors and memory for running dedicated tasks or for running programs under an operating system.

The semiconductor fabrication plant 1000 may include a production setup part 1002 and a manufacturing part 1003. It is possible that no division is made into the two parts 1002 and 1003 or that another division is made. The manufacturing part 1003 may include one or more lithography subsystems 1070 each using a maskless pattern writer 1073. In this example the maskless lithographic exposure system is a charged particle multi-beamlet lithography system and the maskless pattern writer 1073 is a charged particle multi-beamlet lithography machine or e-beam machine.

At the left hand side of FIG. 2 a standard IC design flow 1001 is shown that typically results in the creation of mask order data, design layout data and/or wafer order data, jointly depicted as output 2000. The design layout data is typically generated in a GDSII or OASIS data format. The standard IC design flow is known in the art and typically includes a system/full IC design stage 1010, a circuit design VHL/Verilog stage 1011, a logical verification stage 1012, a placement & routing (P&R) stage 1013, a physical simulation stage 1014 and/or a design rule checks (DRC) stage 1015.

A process design kit 1030 including an add-ons and IP library may provide the building blocks in the form of reusable units of logic, cell or chip layout designs from a function IP blocks storage 1031 to various steps in the standard IC design flow 1001, as depicted by the arrows from the function IP blocks storage 1031 to steps 1011, 1012, 1013, 1014 and 1015 of the standard IC design flow 1001. The process design kit 1030 is typically located within the production setup part 1002 of the fab 1000, as it may concern function IP blocks licensed from an IP block designer 1005 to the chip manufacturer.

The created design layout data typically includes a common design layout part defining layout structures applicable for all of the chips to be created. Furthermore the design layout data may include a non-common design layout part, which may be left blank or undefined. The non-common design layout part will be filled in at a later stage with features selected from a feature data set for individualizing the chips.

The feature data set may be provided together with or separate from the design layout data. Alternatively, the feature data set may be predefined, stored and retrievable within the fab for each use.

The output 2000 of the design flow 1001 may be provided to the charged particle multi-beamlet lithography system via a tape-out and sign-off process 1016. More specifically, the output 2000 may be input to a preparation part 1020 of the production setup 1002 where an optical proximity correction (OPC) operation 1021, a data preparation (PEC, fracturing) operation 1022, a recipe/process program (PP) generation operation 1023 and/or an order and production planning operation 1024 may be performed. The output of each of these operations may be transferred to the manufacturing part 1003 passing a verification step 1040.

In case a photolithography exposure is to be performed to a wafer prior to the maskless lithographic exposure, optical proximity correction (OPC) 1021 may be applied to the GDSII design layout data, resulting in corrected GDSII data 2010, which may be input to a mask shop 1081 together with the mask order data. This may result in a mask set 2011 that may be input to a reticle stocker 1082 from where reticles (masks) 2012 may be input to the CMOS wafer flow 1080. The wafer order data may be used to have wafers 1083 input to the CMOS wafer flow 1080 when needed. The photolithography exposure itself is not shown in FIG. 2. The resulting exposed wafer is shown as wafer 2013. Note that in case no photolithographic exposure is performed, the wafer 2013 may be an unexposed wafer.

The data preparation unit 1022 may pre-process the GDSII design layout data depicted as 2007 into pre-processed design layout data 2008. The pre-processed design layout data 2008 may include data specific to the lithography subsystem 1070. This off-line preprocessing of the GDSII data 2007 may include steps like flattening, proximity correction, resist heating correction and/or drawing of smart boundaries. The pattern vector data 2008 may be stored in a reticle storage 1051 of manufacturing execution system (MES) 1050.

The recipe/PP generation 1023 may generate instructions for the creation of process jobs (PJs). The PP and associated programs may be stored in a recipe/PP database 1052 of the MES 1050. A PP 2005 may be sent from the MES 1050 to a machine control 1072 of the lithography subsystem 1070 to instruct the machine control 1072 to create a PJ based on the PP. Additional commands may include Abort and Cancel instructions.

For example, via the order and production planning 1024 the manufacturing database 1053 of the MES 1050 may be provided with manufacturing specific information. From here a PJ input generator 1054 may be fed with information. The PJ input generator 1054 may provide PJ input to machine control 1072, where PJs 2006 may be generated for controlling parts of the lithography subsystem 1070, in particular rasterizer 1071 and pattern streamer (maskless pattern writer) 1073.

The operation of the lithography subsystem 1070 may be controlled using the PP, which may comprise a sequence of actions to be performed. The machine control 1072 may be loaded with a PP, and may schedule and execute the PP as may be requested by the recipe/PP generation 1023. The PP may take the role of a recipe, e.g. as defined in the SEMI E40 standard. Although the SEMI standards specify many requirements on how to deal with recipes, the standards may be contradictory so that recipes are preferably avoided. Instead, editable and unformatted PP may be used in the form of so-called Binary Large Objects (BLOBs).

The PP may be a pre-planned and reusable portion of the set of instructions, settings and/or parameters that may determine the processing environment of the wafer and that may be subject to change between runs or processing cycles. PPs may be designed by lithography tool designers or may be generated by tooling.

PPs may be uploaded to the lithography system by a user. PPs may be used to create PJs. A PJ may specify the processing to be applied to a wafer or set of wafers by the lithography subsystem 1070. A PJ may define which PP to use when processing a specified set of wafers and may include parameters from the PP (and optionally from the user). A PJ may be a system activity started by a user or host system.

PPs may be used not only for controlling the processing of wafers, but also for service actions, calibration functions, lithography element testing, modifying element settings, updating and/or upgrading software. Preferably no subsystem behavior occurs other than what is prescribed in a PP, with the exception of certain allowed additional categories, such as automatic initialization during power-up of a module or subsystem, periodic and unconditional behavior of a subsystem, as far as those don't influence PJ execution, and the response to an unexpected power-off, emergency or EMO activation.

A PP may be divided into steps. Most steps typically comprise a command and identify a subsystem which is to perform the command. The step may also include parameters to be used in performing the command, and parameter constraints. The PP may also include scheduling parameters to indicate when a step is to be performed, e.g. to be performed in parallel, in sequence, or synchronized.

To execute a command step of the PJ, the machine control 1072 may send the command indicated in the PJ to the subsystem indicated in the relevant step of the PJ. The machine control 1072 may monitor timing and may receive the results from the subsystem.

The pre-processed design layout data 2008 is typically stored in the reticle storage 1051 in a tool input data format, which is a vector format and includes dose information. The pre-processed design layout data 2008 may be provided from the reticle storage 1051 to the rasterizer 1071 of the lithography subsystem 1070, where it may be processed into beamlet control data such as pattern bitmap data 2009 for controlling the maskless pattern writer 1073 to expose a wafer for creation of the chip.

A feature data set 2016 defining features selectable for individualizing the chips may be provided in various manners. In one example the feature data set 2016 may be provided to the rasterizer 1071 using the same network path as used for providing the pre-processed design layout data 2008, as shown in FIG. 2. In another example the feature data set 2016 may be provided with the PP 2005 to the lithography subsystem 1070. In another example the feature data set 2016 may be provided to the lithography subsystem 1070 via PJ input generator 1054. In another example the feature data set 2016 may be provided to a black box device 1060. The feature data set 2016 may be stored within the fab or provided from an external source before use.

The pre-processed design layout data 2008 may include the structures applicable for all of the chips to be manufactured from the wafer. The selection of the features from the feature data set for individualizing the chips may be made based on input from a secured, in-fab black box device 1060, which may generate selection data defining a selection of the features of the feature data set such that a different selection of the features may be made for different chips to be manufactured from the wafer. Alternatively, the black box device 1060 provides subsets of the features applicable to each of the chips to be manufactured, wherein each subset of the features is different. Such subset of features may be provided as a GDSII or OASIS file, which will be relatively small as it only includes the design layout of the non-common, i.e. individualized part of the chip.

The feature data set may include a plurality of different features, such as a circular shaped feature, a feature shaped as a horizontal line, a feature shaped as a vertical line or a cross shaped feature. From this feature data set features may be selected and used multiple times to define the individualized part of the chip. Selection data may be used to indicate which of the features from the feature data set are to be used.

The selection data, which is depicted as 2004 in FIG. 2, may be provided from the black box device 1060 to the PJ input generator 1054. Preferably, the selection data 2004 is encrypted. The PJ input generator 1054 may send the selection data 2004 to the machine control 1072, where a PJ 2006 may be generated instructing the rasterizer 1071 to obtain the indicated features from feature data set and generate the pattern bitmap data 2009 based on the selected features.

Alternatively, the black box device 1060 may be configured to provide the selection data 2004 directly to the lithography subsystem 1070 for provisioning the selection data 2004 to the rasterizer 1071 without involving the PJ input generator 1054.

The feature data set may be provided as a single file, such as a GDSII or OASIS based file. To locate where the selected features from the feature data set are to be created in the to be individualized chip design, feature meta data may be provided. The feature meta data, depicted 2003 in FIG. 2, may be received together with the feature data set in the preparation part 1020. From there the feature meta data 2003 may be provided to the black box device 1060, e.g. via the recipe/PP generator 1023 or via the order and production planning 1024. The latter scenario is shown in FIG. 2, where the feature meta data 2003 follows the route from the order and production planning 1024 to the black box device 1060 via the manufacturing database 2003. The black box 1060 may provide the feature meta data 2003 to the lithography subsystem 1070 following the same route as the selection data described above, e.g. via the PJ input generator 1054, or directly to the lithography subsystem 1070. Alternatively, the feature meta data may be provided to the lithographic subsystem using any of the available network paths.

The black box device 1060 may include an ID/key manager 1061 and a selection data generator 1062 that cooperate in the creation of the selection data 2004. The ID/key manager 1061 may receive product ID/serial number information 2001 from the manufacturing database 1053 and batches of ID/key pairs 2002 from a key management service 1006 possibly located outside of the maskless lithographic exposure system. The product ID/serial number information 2001 and the batches of ID/key pairs 2002 may be used to control the generation of the selection data 2004. Furthermore, the product ID/serial number information 2001 may be used to track the chips through the creation process to be able the chips to be matched with their ID/serial numbers after being created. Alternatively or additionally, the product ID/serial number information 2001 may be used to include the ID/serial number in or on the chip by a not shown but known per sc process.

Exposure of the wafer 2013 according to the pattern bitmap data 2009 may result in exposing a pattern having a different selection of the features from the feature data set for different subsets of the chips. In FIG. 2 this is depicted as exposed wafer 2014. The exposed wafer 2014 may further be processed in accordance with the standard CMOS wafer flow 1080 typically including inspection, etching, deposition CMP and/or slicing steps. The resulting sliced chips 1007 may be unique chips that may be used e.g. in an end-user device 1008 for data security, traceability and/or anti-counterfeiting applications. Arrow 2015 depicts the provisioning of a unique chip to the end-user device 1008.

Process programs (PP) and process jobs (PJ) may be based on the SEMI standard, e.g. SEMI E30: "Generic Model for Communications and Control of Manufacturing Equipment (GEM)", SEMI E40: "Standard for Processing Management", SEMI E42: "Recipe Management Standard: Concepts, Behavior, and Message Services", and/or SEMI E139: "Specification for Recipe and Parameter Management (RaP)".

Figure 3:
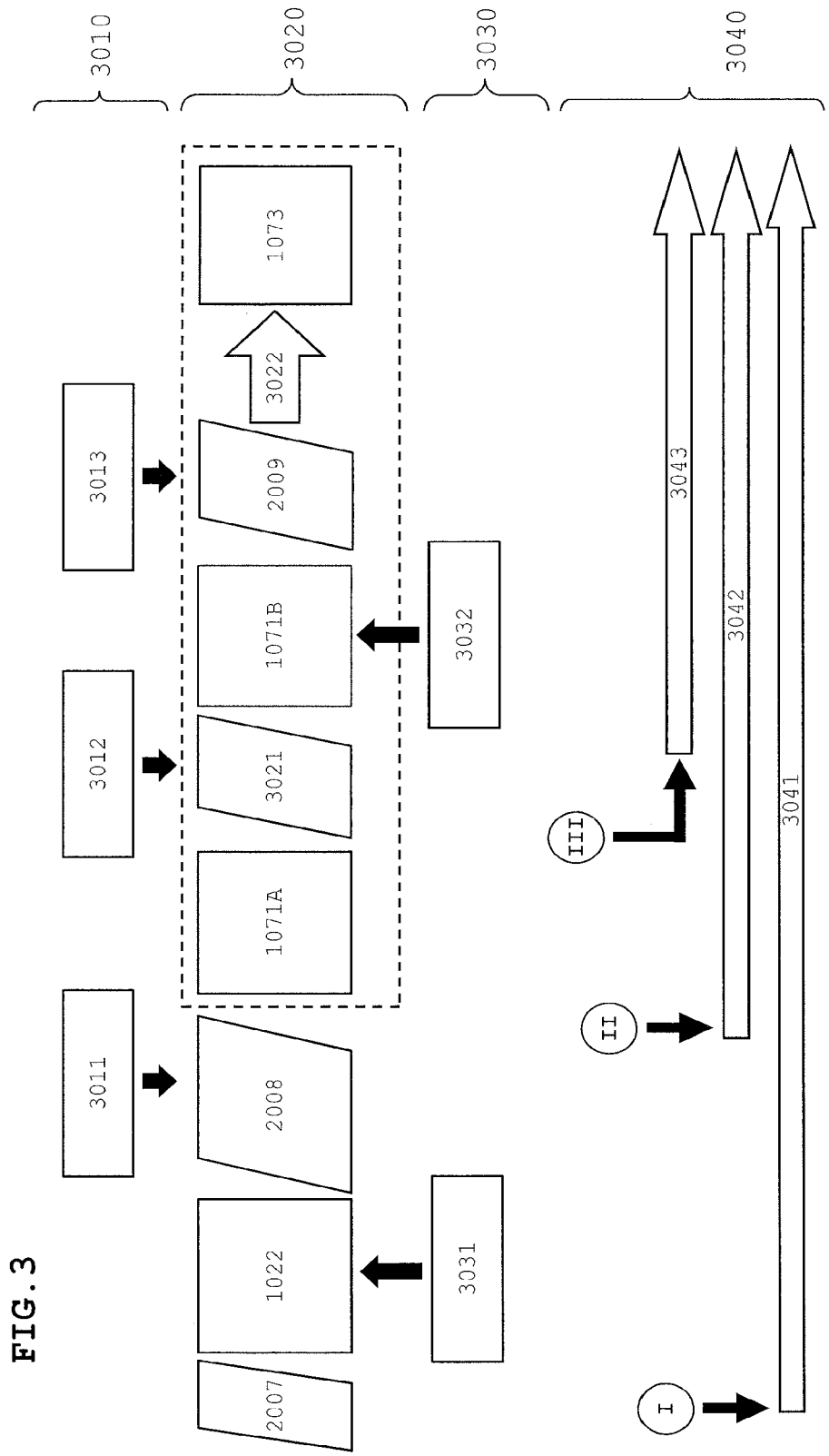
FIG. 3 shows a functional flow diagram of the creation of pattern bitmap data of an exemplary embodiment of the invention.

FIG. 3 shows an exemplary functional flow diagram of a data path using real-line rasterization, which may be followed in the generation of the pattern bitmap data 2009 from the GDSII design layout data 2007. The functional flow of FIG. 3 may be used in the maskless lithographic exposure system of FIG. 2. In FIG. 3 the functional flow diagram is split into four sections: 3010 is used to indicate a data format of underlying data outputs/inputs; 3020 shows the process flow including data outputs/inputs (parallelograms) and functional elements (rectangles); 3030 is used to indicate process steps performed at overlying functional elements; and 3040 is used to indicate how often the process steps are typically performed, e.g. once per design 3041, once per wafer 3042 or once per field 3043. Roman I, II and III indicate when the feature data set and/or the selection data may be provided to the data path.

Input to the process may be the GDSII design layout data 2007, or a design layout in any other suitable format such as an OASIS data format. The GDSII design layout data 2007 may include blank parts or undefined parts where the individualized part is to be inserted.

Data preparation unit 1022 may pre-processes the GDSII file 2007, typically as an off-line pre-processing operation. The pre-processing operation typically includes one or more of a flattening, a proximity correction, a resist heating correction and/or drawing of smart boundaries operation, jointly depicted as 3031. Output of the data preparation 1022 may be the pre-processed design layout data 2008 typically in a vector format including dose information, depicted as 3011. The format of the pre-processed design layout data 2008 is also known as a tool input data format. The data preparation 1022 is typically performed once per design depicted by arrow 3041, but may be performed once per wafer or once per field.

The pre-processing at the data preparation unit 1022 preferably does not expose a specific or unique chip design, i.e. the selection data 2004 is preferably not available at this stage in the data path, advantageously allowing the data preparation unit 1022 and the production setup part 1002 of the fab to be located in a less secure environment.

As described above, it is desirable to minimize exposure and exposure time of the specific or unique chip design part for security reasons. The security aspect is important as the uniqueness of the chip will typically be used for data security, traceability and/or anti-counterfeiting applications. The processes within the dashed block, i.e. from software processing 1071A until hardware processing at the pattern writer 1073, are typically performed within the lithography subsystem 1070 enabling a more secure operating environment. Furthermore, by providing the selection data 2004 only at the software processing 1071A or later, the amount of time that the unique features of the chips is used within the manufacturing part 1003 of the fab may be minimized.

The selection data 2004 is typically provided and used once per field. Roman III indicates the provisioning of the selection data 2004 to the data path at this stage. Alternatively but less preferred, the selection data 2004 may be provided and used once per wafer. Roman II indicates the provisioning of the selection data 2004 to the data path at this stage.

The feature meta data 2003 may be provided to the lithography subsystem 1070 together with the selection data 2004, as described with FIG. 2. Alternatively, the feature meta data may be provided once per design, as indicated with roman I.

The pre-processed GDSII design layout data 2008 may be input to a rasterizer 1071, which may includes a software processing part 1071A and a streaming part 1071B as shown in FIG. 3. Depending on whether the selection data 2004 is to be used once per wafer as depicted by roman II or once per field as depicted by roman III, the software processing part 1071A or the streaming part 1071B may use the selection data 2004 together with the feature meta data 2003 to select the features from the feature data set as defined by the selection data 2004.

In-line processing of the pre-processed design layout data 2008 may be performed at the software processing part 1071A to rasterize the vector data to generate pattern system streaming (PSS) data 3021. The PSS data 3021 may be formatted as 4 bit greyscale bitmap data depicted as 3012.

The rasterizing may be performed in software. The unique chip design part may be realized at this stage, as indicated by roman II. The streaming part 1071B may then processes the PSS data 3021 to generate the pattern bitmap data 2009. Processes performed by the streaming part 1071B may include corrections involving a full or partial pixel shift in the X and/or Y direction for beam position calibration, field size adjustment and/or field position adjustment on the bitmap data. These processes are jointly depicted as 3032. Alternatively to entry point II, the unique design part may be realized at this stage, as indicated by roman III. The pattern bitmap data 2009 may be streamed to a pattern writer 1073 for exposure of the wafer. This streaming of the pattern bitmap data 2009 is depicted as 3022.

Rasterization may be performed at the streaming stage 1071B, which may involves real-time processing performed in hardware. Corrections for beam position calibration, field size adjustment, and/or field position adjustment (jointly depicted 3032) may be made on the vector format PSS format data 3021, and then rasterization may convert this to a pattern bitmap data. When the corrections are made on vector data, full pixel shifts, partial pixel shifts and/or subpixel shifts in the X and Y direction may be made.

The controlling of the maskless pattern writer 1073 typically involves a blanker being controlled by the pattern bitmap data. The pattern bitmap data 2009 may also be referred to as blanker format data.

Figure 4:
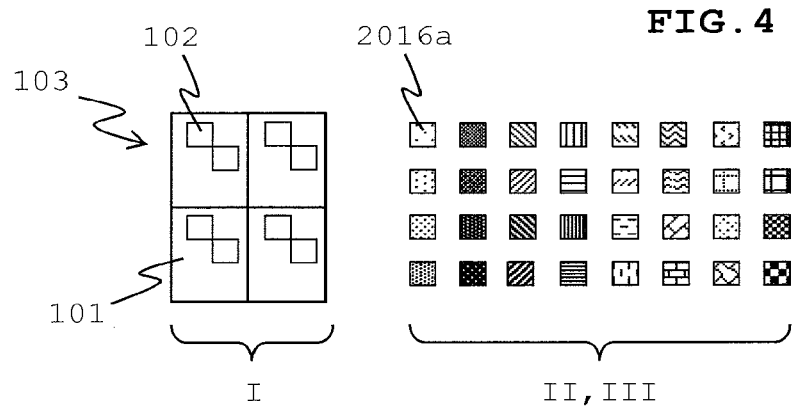
FIG. 4 represents a field defined by design layout data and a feature data set in the form of separate data files according to an exemplary embodiment of the invention.

FIG. 4 shows an exemplary embodiment of a field 103 defined by design layout data and a feature data set in the form of separate data files 2016a. In this example the design layout data defines four unique chips within the field, each chip having a common part 101 that may be identical in all four chips and a to be individualized area 102 that is blank or undefined in the design layout data. The roman I, II and III indicate when, in this example, the respective data may be provided to the data path of FIG. 3.

Each data file 2016a may include a subset of features applicable to one of the chips and may be in a GDSII or OASIS based data format. The black-box device 1060 may be used to create and/or assign the data files 2016a to the different chips, thereby making the selection of the features to be used to individualize the chips.

The rasterizer 1071 may receive the selected files or an indication of which of the data files 2016a to use relevant to the fields that are going to be exposed on the wafer.

Figure 5:
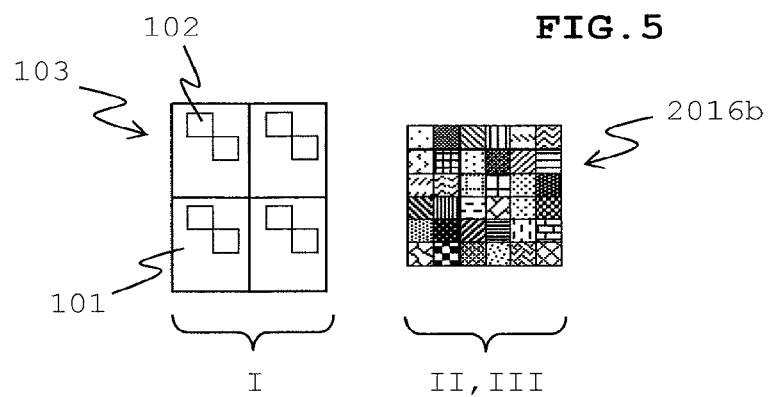
FIG. 5 represents a field defined by design layout data and a feature data set in the form of a single data file according to an exemplary embodiment of the invention.

In the example of FIG. 4 the number of data files 2016a may be very large, which could have a negative impact on data processing time as file I/O operations will be more frequent. In the example of FIG. 5 this problem has been overcome by storing a plurality of subsets of features into a single data file 2016b. As in FIG. 4, each block of the feature data set, in FIG. 5 included in the single data file 2016b, may represent a design layout for the individualized area 102 of a chip and may be stored in a GDSII or OASIS based data format. Use of the feature data set in the example of FIG. 5 is similar to FIG. 4.

Figure 6A:
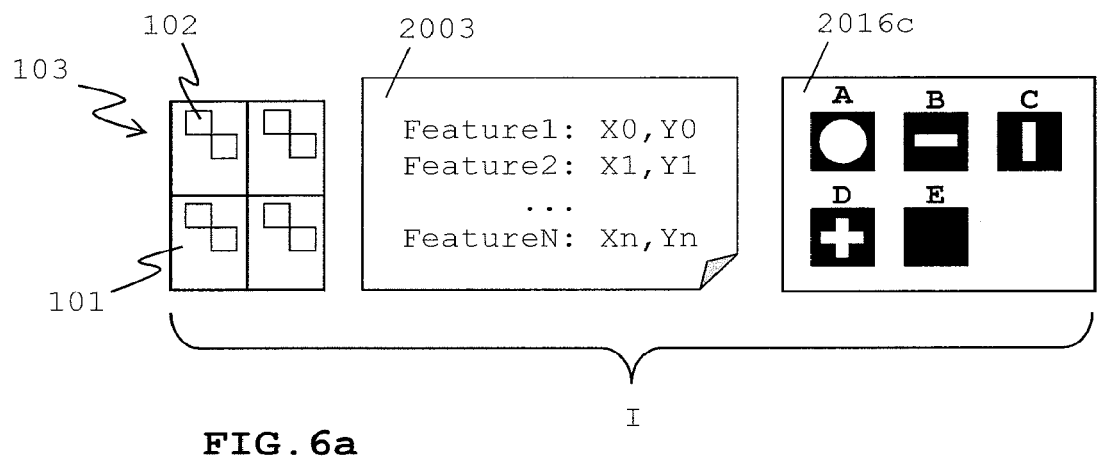
FIG. 6a represents a field defined by design layout data, feature meta data and a feature data set in the form of a set of individual features according to an exemplary embodiment of the invention.
Figure 6B:
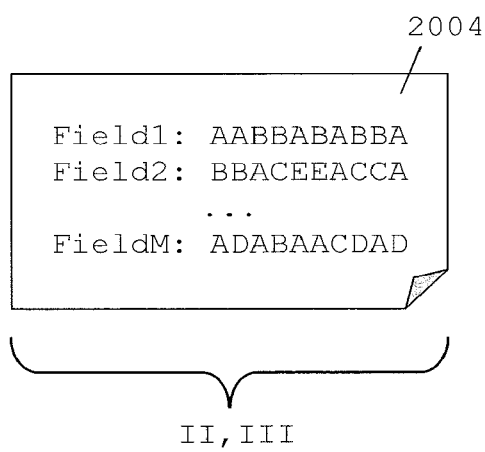
FIG. 6b represents selection data according to an exemplary embodiment of the invention.

In the examples of FIG. 4 and FIG. 5 all possible design layouts of the individualized areas 102 for the chips to be manufactures are typically prepared and stored before use, while the selection of the subset of the features to be used for a particular chip may be made at a late stage, e.g. within the black box device 1060. In the example of FIG. 6a and FIG. 6b the design layout of the individualized areas need not be pre-stored and may also be created at a late stage, e.g. within the black box device 1060 or even at a later stage such as within the rasterizer 1071.

FIG. 6a shows an exemplary embodiment of a field 103 defined by design layout data, feature meta data 2003 and a feature data set 2016c. In this example the design layout data defines four unique chips within the field, each chip having a common part 101 that may be identical in all four chips and a to be individualized area 102 that is blank or undefined in the design layout data. The roman I, II and III indicate when, in this example, the respective data may be provided to the data path of FIG. 3.

In this example the feature data set 2016c includes features A-E. Feature A represents a circular shaped feature, feature B represents a feature shaped as a horizontal line, feature C represents a feature shaped as a vertical line, feature D represents a cross shaped feature, and feature E represents a transparent/blank feature. The feature data set 2016c may include any number of features and may include other or different shapes than shown in FIG. 6a. Non limiting examples of other features not shown in FIG. 6a are lines of different width, circles, lines with different orientations, elbow structures with different orientations, rectangles, and combinations of shapes in a single feature.

Preferably, the feature data set 2016c includes a plurality of different features. The feature data set 2016c typically does not include indicators A-E, which are shown in FIG. 6a for illustrative purposes only. The features may be stored in the feature data set 2016c in any suitable data format, e.g. using a GDSII or OASIS based data format.

Feature meta data 2003 may be used to indicate a location of an individualized area 102 where selected features from the feature data set 2016c are to be created. Feature1 as indicated in the feature meta data 2003, may corresponds to the top left individualized area, which is depicted by the reference number 102. According to the feature meta data 2003 the location within the chip design of Feature1 is X0,Y0. Similarly, Features2 to FeatureN may define the locations of other individualized areas where selected features from the feature data set 2016c are to be created. In this example the coordinates of each feature are represented as an X,Y location. It will be understood that any other coordination system or indication of a location within the design layout may be used instead.

The feature meta data 2003 may include, in addition to the location information, additional information, such as a width and/or a height of the individualized areas 102. The feature meta data may be optimized, e.g. by including meta data common to multiple features only once.

FIG. 6b shows an exemplary embodiment of selection data 2004, which may be used together with the example of FIG. 6a. The selection data 2004 may contain a list of fields and for each field n letters indicating which feature is to be included. Letter A-E as shown in FIG. 6b may be used as an indication of a feature, or any other indication such as a 4-bit nibble or 8-bit byte. In the example of FIG. 6b n equals 10, i.e. ten features are selected per field. The location of the selected feature within the field may correspond with the index of the corresponding letter, i.e. the order of the letters as defined for each field in the selection data 2004 may define the order of the corresponding features in the field. In this example the fields are numbered from Field1 to FieldM, M being any positive index number. It will be understood that any other identification of the fields may be used instead or the identification of the fields may be left out completely using the position of each set of field letters within a file (e.g. counting the line numbers) as identification of the fields.

The rasterizer 1071 may receive the selection data 2004 or a subset of the selection data relevant to the fields that are going to be exposed on the wafer. The selection data 2004 may be used to create the selected features from the feature data set 2016c at the locations as defined by the feature meta data 2003.

Figure 7:
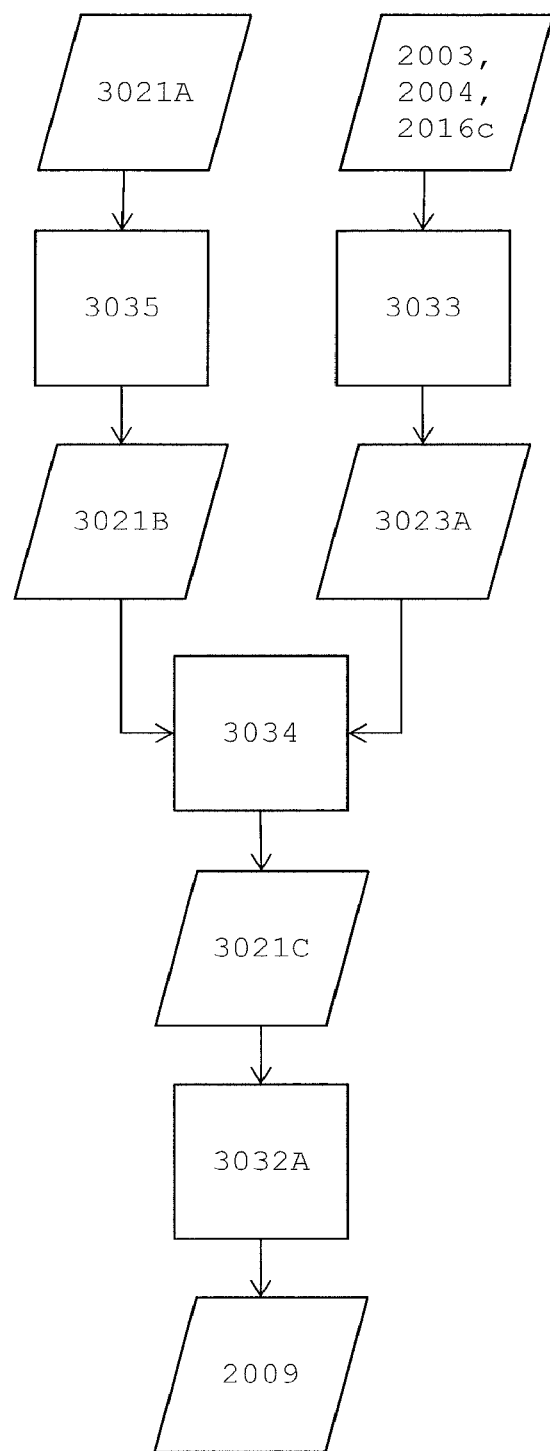
FIG. 7 shows a functional flow diagram of the creation of pattern bitmap data, according to an exemplary embodiment of the invention.

FIG. 7 represents a data flow in a part of a data path involved in the creation of pattern bitmap data 2009, according to an exemplary embodiment of the invention. Data is indicated as parallelograms and process steps are indicated as rectangular boxes.

At the start of the data flow on the left, pre-processed design layout data 2008 may have been processed into an intermediate 4 bits-per-pixel grey level bitmap 3021B, or any other suitable bitmap format, by a rasterizer 1071 e.g. as shown in FIG. 2 or any other processing unit, preferably part of a lithography subsystem 1070. This intermediate 4 bpp grey level bitmap 3021B may include the structures of the common part 101 of the chips to be created. The to be individualized part of the chip design may be left blank in the intermediate 4 bpp grey level bitmap 3021B. Optionally the intermediate 4 bpp grey level bitmap is in a compressed format 3021A and decompressed in a decompression step 3035. ZIP compression or any other suitable compression format may be used as a compression format.

On the top right, feature meta data 2003, selection data 2004 and a feature data set 2016c may be used to create a 4 bits-per-pixel grey level bitmap mask 3023A, or a mask in any other suitable bitmap format, using a mask creation process 3033. The mask data 3023A is typically in a form allowing it to function as an overlay mask for complementing the intermediate bitmap 3021B by filling the blanks of the intermediate bitmap 3021B with individualized areas 102 defined by the mask 3023A. The mask data 3023A may be formatted in a sparse bitmap format, allowing the mask data 3023A to be compressed with a high compression rate. The mask data 3023A may be intermediately stored in a compressed format and decompressed, possibly in real-time, before use in merger operation 3034.

In a merger operation 3034 the intermediate 4 bpp grey level bitmap 3021B and the mask data 3023A may be merged, e.g. using an OR operation, resulting in the blank areas that are to be individualized in the intermediate bitmap 3021B to be filled in with the bitmap information from the mask data 3023A. Possibly, only a part of the intermediate 4 bpp grey level bitmap 3021B and a part of the mask data 3023A needed for the part of the wafer to be exposed just ahead in time are used in the merger operation 3034.

The resulting 4 bpp grey scale bitmap 3021C may be processed for pattern streamer corrections and a B/W dithering operation may be performed, as indicated as processing step 3032A. Processing step 3032A may be similar to operation 3032 of FIG. 3. This may results in the pattern bitmap data 2009 for controlling a maskless pattern writer, such as the maskless pattern writer 1073 of FIG. 3.

The processes 3033, 3034, 3035 and 3032A may be performed by a rasterizer 1071 or any other processing unit, preferably part of a lithography subsystem 1070. Processes 3032A, 3034 and/or 3035 may be performed in real-time. Typically, one or more of the process steps shown in FIG. 7 are performed in RAM memory and the mask data 3023A (or a part thereof), the intermediate 4 bpp grey level bitmap 3021B and/or the 4 bpp grey scale bitmap 3021C are stored in RAM memory only during processing of the data into the pattern bitmap data 2009. For increased processing performance, preferably the merger operation 3034 and possibly also the decompression operation 3035 are implemented in hardware, e.g. in FPGA or ASIC.

In an exemplary embodiment the intermediate 4 bpp grey scale bitmap 3021B may define a stripe of a field of a wafer, e.g. covering an area of 2 µm by 33 mm of the wafer. Each 4 bits pixel of the intermediate 4 bpp grey scale bitmap 3021B may cover an area of 5.4 nm by 5.4 nm. The mask 3023A may be a 4 bpp bitmap covering one stripe or scan line on the wafer, e.g. covering an area of 2 µm by 300 mm. Each 4 bits pixel of the mask 3023A may cover an area of 5.4 nm by 5.4 nm in this example. Thus, the mask may have the same resolution as the intermediate 4 bpp grey scale bitmap, resulting in the merger operation 3034 to complement the blanks in the intermediate bitmap 3021B with the data from the mask 3023A.

Optionally the mask data 3023A, especially when in a sparse bitmap format, may be stored in a compressed format in RAM and decompressed on the fly when performing the merger operation 3034.

Figure 8:
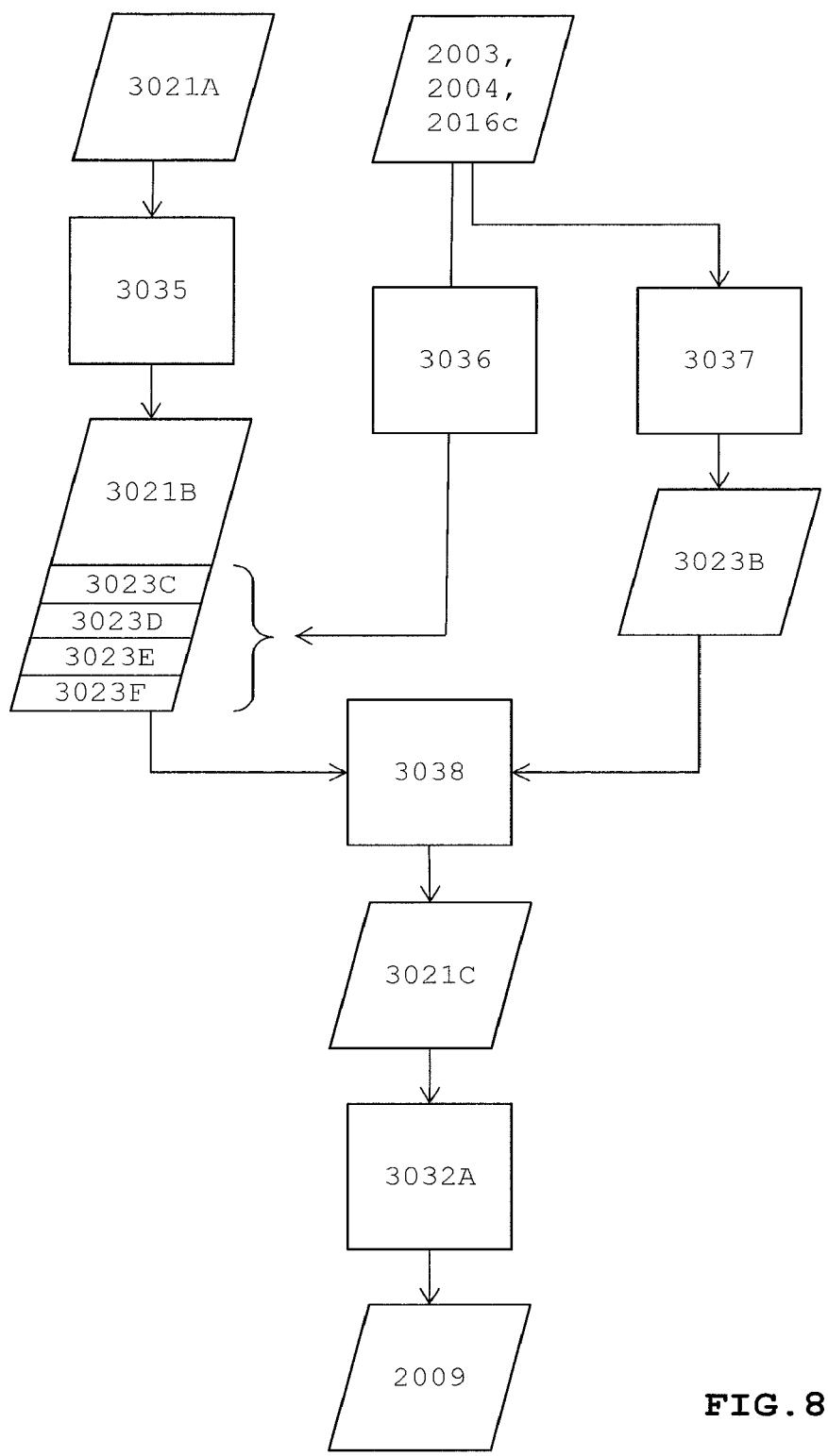
FIG. 8 shows a functional flow diagram of the creation of pattern bitmap data, according to another exemplary embodiment of the invention.

FIG. 8 represents a data flow in a part of a data path involved in the creation of pattern bitmap data 2009, according to another exemplary embodiment of the invention. Data is indicated as parallelograms and process steps are indicated as rectangular boxes.

At the start of the data flow on the left, pre-processed design layout data 2008 may have been processed into an intermediate 4 bits-per-pixel grey level bitmap 3021B, or any other suitable bitmap format, by a rasterizer 1071 e.g. as shown in FIG. 2 or any other processing unit, preferably part of a lithography subsystem 1070. This intermediate 4 bpp grey level bitmap 3021B may include the structures of the common part 101 of the chips to be created. The to be individualized part of the chip design may be left blank in the intermediate 4 bpp grey level bitmap 3021B. Optionally the intermediate 4 bpp grey level bitmap is in a compressed format 3021A and decompressed in a decompression step 3035. ZIP compression or any other suitable compression format may be used as a compression format.

Feature meta data 2003, selection data 2004 and/or a feature data set 2016c may be used to create a number of 4 bits-per-pixel grey level bitmap fragments 3023C-3023F, or fragments in any other suitable bitmap format, using a fragment creation process 3036. One fragment 3023C-3023F may include bitmap information for one unique chip or one batch of unique chips. Typically the number of fragments 3023C-3023F corresponds with the number of unique parts that will be written on the wafer with each scan line or stripe. The fragments 3023C-3023F may be updated just before each scan line (or stripe) exposure of the wafer. Alternatively, fragments 3023C-3023F may be created and temporarily stored before being used.

The feature meta data 2003, selection data 2004 and/or a feature data set 2016c may further be used to create a fragment assignment table 3023B using a table creation process 3037. The table 3023B may indicate where fragments, e.g. the fragments 3023C-3023F, are to be written on the wafer. The table 3023B may include information for all fragments that are to be written on the wafer with one scan line or stripe, in which case the table 3023B may be updated before each scan. Alternatively, the table 3023B may include information for less or for more fragments, in which case the frequency of updating the table 3023B will be adapted accordingly. The fragment assignment table 3023B may be in any suitable data format, e.g. in the form of a data table or any other data format.

The fragments 3023C-3023F are typically in a form allowing it to be inserted into the intermediate bitmap 3021B by filling blanks of the intermediate bitmap 3021B with (parts of) the individualized areas 102 defined by the fragments 3023C-3023F.

In an insertion operation 3038 the fragments 3023A-3023F may be inserted into the intermediate 4 bpp grey level bitmap 3021B under control of the fragment assignment table 3023B. An OR operation or any other suitable operation may be used for the insertion operation 3038. The insertion operation results in the blank areas that are to be individualized in the intermediate bitmap 3021B to be filled in with the bitmap information from the assigned fragments 3023C-3023F. Possibly, only a part of the fragments 3023C-3023F, a part of the intermediate 4 bpp grey level bitmap 3021B and a part of the fragment assignment table 3023B needed for the part of the wafer to be exposed just ahead in time are used in the insertion operation 3038.

The resulting 4 bpp grey scale bitmap 3021C may be processed for pattern streamer corrections and a B/W dithering operation may be performed, as indicated as processing step 3032A. Processing step 3032A may be similar to operation 3032 of FIG. 3. This may results in the pattern bitmap data 2009 for controlling a maskless pattern writer, such as the maskless pattern writer 1073 of FIG. 3.

The processes 3035, 3036, 3037, 3038 and 3032A may be performed by a rasterizer 1071 or any other processing unit, preferably part of a lithography subsystem 1070. Processes 3035 and/or 3038 may be performed in real-time. Preferably, one or more of the process steps shown in FIG. 7 are performed in RAM memory and the fragment assignment table 3023B, the fragments 3023C-3023F, the intermediate 4 bpp grey level bitmap 3021B and/or the 4 bpp grey scale bitmap 3021C, or parts thereof, are stored in RAM memory only during processing of the data into the pattern bitmap data 2009. For increased processing performance, preferably the insertion operation 3038 and possibly also the decompression operation 3035 are implemented in hardware, e.g. in FPGA or ASIC.

In an exemplary embodiment the intermediate 4 bpp grey scale bitmap 3021B may define a stripe of a field of a wafer, e.g. covering an area of 2 µm by 33 mm of the wafer. Each 4 bits pixel of the intermediate 4 bpp grey scale bitmap 3021B may cover an area of 5.4 nm by 5.4 nm. The fragments 3023C-3023F may be 4 bpp bitmaps covering a part of one stripe or scan line on the wafer. Thus, the fragments may have the same resolution as the intermediate 4 bpp grey scale bitmap, resulting in the insertion operation 3038 to complement the blanks in the intermediate bitmap 3021B with the data from the fragments 3023C-3023F. The fragment assignment table 3023B may include the information needed to select the fragment to be inserted for the current scan line or stripe. Hereto the table 3023B may include scan line numbers assigned to fragments.

In the example of FIG. 8, fragments 3023C-3023F may be used to complement an intermediate 4 bpp grey level bitmap 3021B that may include the structures of the common part 101 of the chips to be created. In an alternative embodiment the 4 bpp grey scale bitmap 3021C may be created from fragments 3023C-3023F only, i.e. without an intermediate 4 bpp grey level bitmap 3021B, and under control of a fragment assignment table 3023B. In this example the selected fragments may be inserted into the 4 bpp grey scale bitmap 3021C by insertion operation 3038, and together may include all the structures to be created with the next scan line or stripe exposure of the wafer.

Figure 9:
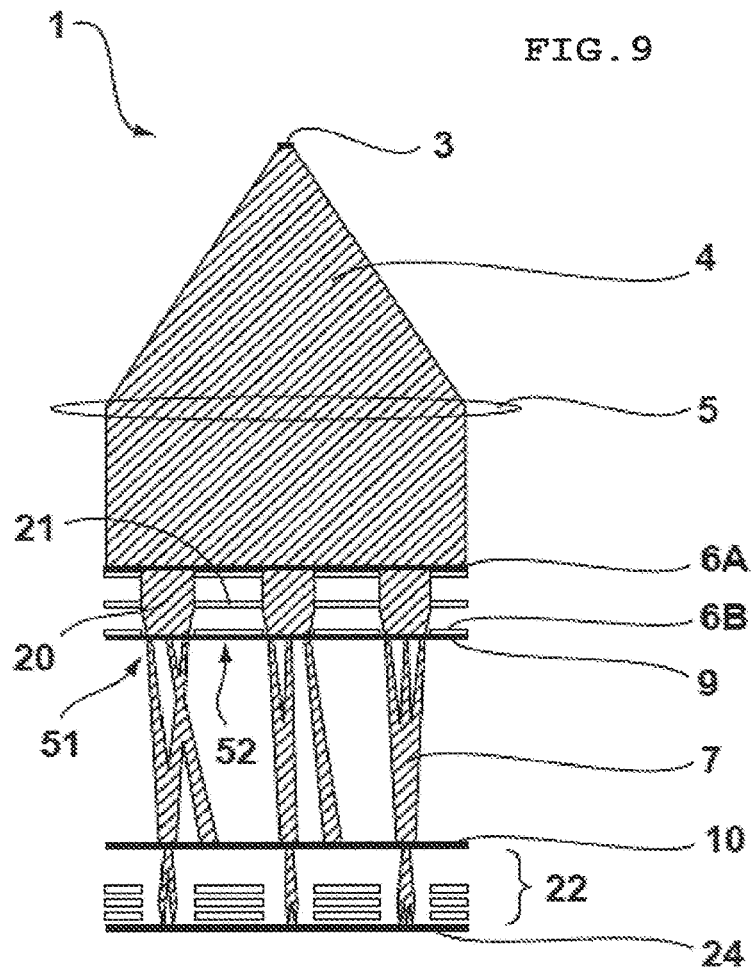
FIG. 9 shows a simplified schematic drawing of an exemplary embodiment of a charged particle multi-beamlet lithography system.

FIG. 9 shows a simplified schematic drawing of an exemplary embodiment of a charged particle multi-beamlet lithography machine 1, which may be used for implementing the maskless pattern writer 1073. Such a lithography machine suitably comprises a beamlet generator generating a plurality of beamlets, a beamlet modulator patterning said beamlets into modulated beamlets, and a beamlet projector for projecting said beamlets onto a surface of a target. The target is for example a wafer. The beamlet generator typically comprises a source and at least one aperture array. The beamlet modulator is typically a beamlet blanker with a blanking deflector array and a beam stop array. The beamlet projector typically comprises a scanning deflector and a projection lens system.

The lithography machine 1 may comprise an electron source 3 for producing a homogeneous, expanding electron beam 4. Beam energy is preferably maintained relatively low in the range of about 1 to 10 keV. To achieve this, the acceleration voltage is preferably low, the electron source preferably kept at between about −1 to −10 kV with respect to the target at ground potential, although other settings may also be used.

The electron beam 4 from the electron source 3 may pass a double octopole and subsequently a collimator lens 5 for collimating the electron beam 4. As will be understood, the collimator lens 5 may be any type of collimating optical system. Subsequently, the electron beam 4 may impinge on a beam splitter, which is in one suitable embodiment an aperture array 6A. The aperture array 6A may block part of the beam and may allow a plurality of subbeams 20 to pass through the aperture array 6A. The aperture array preferably comprises a plate having through-holes. Thus, a plurality of parallel electron subbeams 20 may be produced.

A second aperture array 6B may create a number of beamlets 7 from each subbeam. Beamlets are also being referred to as e-beams. The system may generate a large number of beamlets 7, preferably about 10,000 to 1,000,000 beamlets, although it is of course possible to use more or less beamlets. Note that other known methods may also be used to generate collimated beamlets. This allows the manipulation of the subbeams, which turns out to be beneficial for the system operation, particularly when increasing the number of beamlets to 5,000 or more. Such manipulation is for instance carried out by a condenser lens, a collimator, or lens structure converging the subbeams to an optical axis, for instance in the plane of the projection lens.

A condenser lens array 21 (or a set of condenser lens arrays) may be included behind the subbeam creating aperture array 6A, for focusing the subbeams 20 towards a corresponding opening in the beam stop array 10. A second aperture array 6B may generate beamlets 7 from the subbeams 20. Beamlet creating aperture array 6B is preferably included in combination with the beamlet blanker array 9.

For instance, both may be assembled together so as to form a subassembly. In FIG. 9, the aperture array 6B produces three beamlets 7 from each subbeam 20, which strike the beam stop array 10 at a corresponding opening so that the three beamlets are projected onto the target by the projection lens system in the end module 22. In practice a much larger number of beamlets may be produced by aperture array 6B for each projection lens system in end module 22. In one embodiment, 49 beamlets (arranged in a 7×7 array) may be generated from each subbeam and are directed through a single projection lens system, although the number of beamlets per subbeam may be increased to 200 or more.

Generating the beamlets 7 stepwise from the beam 4 through an intermediate stage of subbeams 20 has the advantage that major optical operations may be carried out with a relatively limited number of subbeams 20 and at a position relatively remote from the target. One such operation is the convergence of the subbeams to a point corresponding to one of the projection lens systems. Preferably the distance between the operation and the convergence point is larger than the distance between the convergence point and the target. Most suitably, use is made of electrostatic projection lenses in combination herewith. This convergence operation enables the system to meet requirements of reduced spot size, increased current and reduced point spread, so as to do reliable charged particle beam lithography at advanced nodes, particularly at nodes with a critical dimension of less than 90 nm.

The beamlets 7 may next pass through an array of modulators 9. This array of modulators 9 may comprise a beamlet blanker array having a plurality of blankers, which are each capable of deflecting one or more of the electron beamlets 7. The blankers may more specifically be electrostatic deflectors provided with a first and a second electrode, the second electrode being a ground or common electrode. The beamlet blanker array 9 constitutes with beam stop array 10 a modulating device. On the basis of beamlet control data, the modulating means 8 may add a pattern to the electron beamlets 7. The pattern may be projected onto the target 24 by means of components present within an end module 22.

In this embodiment, the beam stop array 10 comprises an array of apertures for allowing beamlets to pass through. The beam stop array, in its basic form, may comprise a substrate provided with through-holes, typically round holes although other shapes may also be used. In one embodiment, the substrate of the beam stop array 8 may be formed from a silicon wafer with a regularly spaced array of through-holes, and may be coated with a surface layer of a metal to prevent surface charging. In one embodiment, the metal may be of a type that does not form a native-oxide skin, such as CrMo.

In one embodiment, the passages of the beam stop array 10 may be aligned with the holes in the beamlet blanker array 9. The beamlet blanker array 9 and the beamlet stop array 10 typically operate together to block or let pass the beamlets 7. If beamlet blanker array 9 deflects a beamlet, it will not pass through the corresponding aperture in beamlet stop array 10, but instead will be blocked by the substrate of beamlet block array 10. But if beamlet blanker array 9 does not deflect a beamlet, then it will pass through the corresponding apertures in beamlet stop array 10 and will then be projected as a spot on a target surface 13 of the target 24.

The lithography machine 1 may furthermore comprise a data path for supplying beamlet control data, e.g. in the form of pattern bitmap data 2009, to the beamlet blanker array 9. The beamlet control data may be transmitted using optical fibers. Modulated light beams from each optical fiber end may be projected on a light sensitive element on the beamlet blanker array 9. Each light beam may hold a part of the pattern data for controlling one or more modulators coupled to the light sensitive element.

Subsequently, the electron beamlets 7 may enter the end module. Hereinafter, the term 'beamlet' refers to a modulated beamlet. Such a modulated beamlet effectively comprises time-wise sequential portions. Some of these sequential portions may have a lower intensity and preferably have zero intensity—i.e. portions stopped at the beam stop. Some portions may have zero intensity in order to allow positioning of the beamlet to a starting position for a subsequent scanning period.

The end module 22 is preferably constructed as an insertable, replaceable unit, which comprises various components. In this embodiment, the end module may comprise a beam stop array 10, a scanning deflector array 11, and a projection lens arrangement 12, although not all of these need be included in the end module and they may be arranged differently.

After passing the beamlet stop array 10, the modulated beamlets 7 may pass through a scanning deflector array 11 that provides for deflection of each beamlet 7 in the X- and/or Y-direction, substantially perpendicular to the direction of the undeflected beamlets 7. In this embodiment, the deflector array 11 may be a scanning electrostatic deflector enabling the application of relatively small driving voltages.

Next, the beamlets may pass through projection lens arrangement 12 and may be projected onto a target surface 24 of a target, typically a wafer, in a target plane. For lithography applications, the target usually comprises a wafer provided with a charged-particle sensitive layer or resist layer. The projection lens arrangement 12 may focus the beamlet, for example resulting in a geometric spot size of about 10 to 30 nanometers in diameter. The projection lens arrangement 12 in such a design for example provides a demagnification of about 100 to 500 times. In this preferred embodiment, the projection lens arrangement 12 is advantageously located close to the target surface.

In some embodiments, a beam protector may be located between the target surface 24 and the focusing projection lens arrangement 12. The beam protector may be a foil or a plate, provided with needed apertures, for absorbing the resist particles released from the wafer before they can reach any of the sensitive elements in the lithography machine. Alternatively or additionally, the scanning deflection array 9 may be provided between the projection lens arrangement 12 and the target surface 24.

Roughly speaking, the projection lens arrangement 12 focuses the beamlets 7 to the target surface 24. Therewith, it further ensures that the spot size of a single pixel is correct. The scanning deflector 11 may deflect the beamlets 7 over the target surface 24. Therewith, it needs to ensure that the position of a pixel on the target surface 24 is correct on a microscale. Particularly, the operation of the scanning deflector 11 needs to ensure that a pixel fits well into a grid of pixels which ultimately constitutes the pattern on the target surface 24. It will be understood that the macroscale positioning of the pixel on the target surface is suitably enabled by a wafer positioning system present below the target 24.

Such high-quality projection may be relevant to obtain a lithography machine that provides a reproducible result. Commonly, the target surface 24 comprises a resist film on top of a substrate. Portions of the resist film may be chemically modified by application of the beamlets of charged particles, i.e. electrons. As a result thereof, the irradiated portion of the film may be more or less soluble in a developer, resulting in a resist pattern on a wafer. The resist pattern on the wafer may subsequently be transferred to an underlying layer, i.e. by implementation, etching and/or deposition steps as known in the art of semiconductor manufacturing. Evidently, if the irradiation is not uniform, the resist may not be developed in a uniform manner, leading to mistakes in the pattern. Moreover, many of such lithography machines make use of a plurality of beamlets. No difference in irradiation ought to result from deflection steps.

Figure 10:
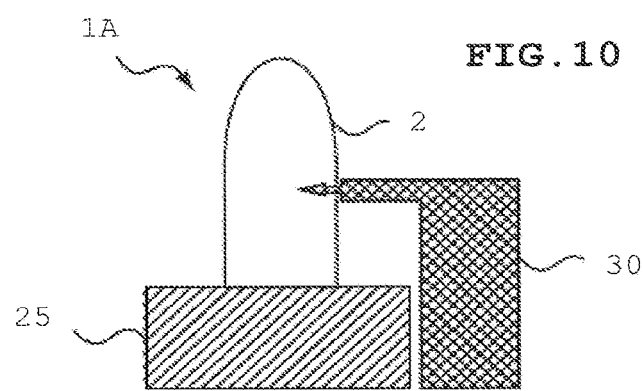
FIG. 10 is a conceptual diagram showing an exemplary maskless lithography system.

FIG. 10 shows a conceptual diagram of an exemplary charged particle lithography system 1A, divided into three high level sub-systems: a wafer positioning system 25, an electron optical column 20, and data path 30. The wafer positioning system 25 moves the wafer 24 under the electron optical column 20 in the x-direction. The wafer position system 25 may be provided with synchronization signals from the data path sub-system 30 to align the wafer with the electron beamlets generated by the electron-optical column 20. The electron-optical column 20 may include the charged particle multi-beamlet lithography machine 1 as shown in FIG. 9. Switching of the beamlet blanker array 9 may also be controlled via the data path sub-system 30, using pattern bitmap data 2009. The data path sub-system 30 may be implemented in accordance with FIG. 3.

As shown in the above examples, a maskless pattern writer may apply a raster scan to the wafer under control of pattern bitmap data. Alternatively, a maskless pattern writer may apply a vector scan to the wafer. A vector scan typically differs from a raster scan in that it does no sequentially go through every location of the wafer; instead, it finishes exposing one local area and flies to the next. With vector scanning a beam settling time is typically needed before the subsequent exposure resumes. This settling time is typically not needed for the raster scan. The pattern bitmap data and the control data for vector scanning may generally be referred to as beamlet control data.

The invention claimed is:

1. A method of manufacturing electronic devices using a maskless lithographic exposure system using a maskless pattern writer that is arranged to write patterns onto a wafer directly using a charged particle beam, the method comprising:
    generating control data for controlling the maskless pattern writer to expose the wafer for creation of the electronic devices, wherein the control data is generated based on a feature data set defining features selectable for individualizing the electronic devices; and
    exposing by the maskless pattern writer of the wafer according to the control data resulting in writing patterns corresponding to features selected from the feature data set.

2. The method of claim 1, wherein the control data is generated further based on design layout data defining structures applicable for all of the electronic devices to be manufactured from the wafer, and
    wherein the feature data set defines the plurality of features selectable for complementing the structures defined in the design layout data.

3. The method of claim 1, wherein the feature data set comprises a plurality of data files, wherein each data file comprises a subset of the features applicable to one of different subsets of the electronic devices.

4. The method of claim 1, wherein the feature data set comprises a data file, wherein the data file comprises a plurality of subsets of the features, wherein each subset of the features is applicable to one of different subsets of the electronic devices.

5. The method of claim 1, wherein the step of generating the control data is additionally based on:
   selection data defining a selection of the features of the feature data set for individualizing the electronic devices, the selection data defining a different selection of the features for different subsets of the electronic devices to be manufactured from the wafer.

6. The method of claim 1, wherein the feature data set includes at least one of:
   a circular shaped feature;
   a feature shaped as a line having a first orientation and having a first width;
   a feature shaped as a line having a second orientation perpendicular to the first orientation;
   a feature shaped as a line having a second width different from the first width;
   a feature shaped as an elbow structure;
   a feature shaped as a rectangle,
   a feature shaped as a plus sign.

7. The method of claim 1, wherein the step of generating the control data is additionally based on feature meta data, wherein the feature meta data specifies a location where the features from the feature data set selected using the selection data are to be created for individualizing the electronic devices.

8. The method of claim 7, further comprising:
   generating one or more bitmap fragments from the selected features, wherein each bitmap fragment defines a part of a stripe to be exposed on the wafer;
   selecting a bitmap fragment from the one or more bitmap fragments for inclusion in the control data based on the feature meta data.

9. The method of claim 1, wherein the electronic devices are semi-conductor chips, and wherein the maskless pattern writer is a charged particle multi-beam lithography machine.

10. The method of claim 1, wherein the charged particle beam includes a plurality of beams.

11. A lithography subsystem comprising a rasterizer and a maskless pattern writer that is arranged to write patterns onto a wafer directly using a charged particle beam,
   wherein the rasterizer is configured to generate control data for controlling the maskless pattern writer to expose the wafer for the creation of electronic devices, wherein the control data is generated based on a feature data set defining features selectable for individualizing the electronic devices,
   wherein exposure of the wafer according to the control data results in writing patterns corresponding to features selected from the feature data set.

12. The lithography subsystem of claim 11, wherein the generating of the control data is additionally based on:
   selection data defining a selection of the features of the feature data set for individualizing the electronic devices, the selection data defining a different selection of the features for different subsets of the electronic devices to be manufactured from the wafer.

13. The lithography subsystem of claim 12, wherein the generating of the control data is additionally based on feature meta data, wherein the feature meta data specifies a location where the features from the feature data set selected using the selection data are to be created for individualizing the electronic devices.

14. The lithography subsystem of claim 11, wherein the charged particle beam includes a plurality of beams.

15. A charged particle exposure machine for manufacturing electronic devices, the charged particle exposure machine comprising:
   a beam generator generating a charged particle beam; and
   a beam modulator modulating the beam to expose patterns onto a target based on control data, wherein the control data is generated based on a feature data set defining features selectable for individualizing the electronic devices, and wherein the patterns correspond to features selected from the feature data set.

16. The charged particle exposure machine of claim 15, wherein the beam modulator is configured to switch the beam on or off according the control data.

17. The charged particle exposure machine of claim 15, further comprising a data path for transmitting the control data to the beam modulator.

18. The charged particle exposure machine of claim 15, wherein the beam generator further includes an aperture array forming a plurality of beams from the charged particle beam, and
   wherein the beam modulator is configured to modulate the plurality of beams.

19. The charged particle exposure machine of claim 15, wherein the control data is generated further based on design layout data defining structures applicable for all of the electronic devices to be manufactured from the wafer, and
   wherein the feature data set defines the plurality of features selectable for complementing the structures defined in the design layout data.

20. The charged particle exposure machine of claim 15, wherein the control data is generated further based on selection data defining a selection of the features of the feature data set for individualizing the electronic devices, the selection data defining a different selection of the features for different subsets of the electronic devices to be manufactured from the wafer.

* * * * *